(12) United States Patent
Motz

(10) Patent No.: US 6,433,544 B1
(45) Date of Patent: Aug. 13, 2002

(54) MAGNETIC FIELD SENSOR WITH LADDER-TYPE FILTER

(75) Inventor: Mario Motz, Wernberg (AT)

(73) Assignee: Micronas GmbH, Freiburg (DE)

( * ) Notice: Subject to any disclaimer, the term of this patent is extended or adjusted under 35 U.S.C. 154(b) by 52 days.

(21) Appl. No.: 09/693,537

(22) Filed: Oct. 20, 2000

(30) Foreign Application Priority Data

Oct. 22, 1999 (DE) .......................................... 199 51 045

(51) Int. Cl.⁷ ...................... G01R 33/06; G01R 33/07; G01D 5/14
(52) U.S. Cl. ...................... 324/251; 338/324; 327/511
(58) Field of Search .............................. 324/251, 207.2, 324/235, 225; 338/324; 327/511

(56) References Cited

U.S. PATENT DOCUMENTS 5,604,433 A * 2/1997 Theus et al. ................. 324/257

FOREIGN PATENT DOCUMENTS

| EP | 0 793 075 A1 | 3/1996 |
| WO | WO 99/21023 | 4/1999 |

* cited by examiner

Primary Examiner—Walter E. Snow
(74) Attorney, Agent, or Firm—Harness, Dickey & Pierce, P.L.C.

(57) ABSTRACT

Described is a magnetic field sensor with a Hall element and a rectangular change-over switch, which controls the Hall element, dependent upon a timing signal. An active ladder-type filter creates a low pass filtered outlet signal. It uses OTA modules, which work with gyrator switching. By means of a chopper operation, capacitors, dependent on the timing signal, are charged alternately from the outlets of the OTA modules.

9 Claims, 3 Drawing Sheets

MAGNETIC FIELD SENSOR WITH LADDER-TYPE FILTER

BACKGROUND OF THE INVENTION

1. Technical Field

The invention concerns a magnetic field sensor with a Hall-element and with a rectangular change-over switch, which switches between connections for the supply current for the Hall-element and connections for the Hall-voltage, dependent on a timing signal, and with a filter circuit, which filters the signal delivered by the rectangular change-over switch.

2. Discussion

A magnetic field sensor of this kind is known from DE-A44 31 703 by the same applicant. Because of the rectangular change-over switch the offset voltage occurring at the Hall-element is largely eliminated in the temporal average, whereby the measurement accuracy is increased overall. One disadvantage with the known magnetic field sensor is that because of the rectangular change-over switch the output signal is not exactly constant over time, but rather that there arises at switchover points in time a discontinuity of the course, because the offset voltage overlays the Hall-voltage in a rectangular shape and at switchover points the operational status is not defined for brief periods because of ever present switching differences. The output signal is thus faulty at least at these switchover points in time and cannot be evaluated. There are at present numerous cases of applications wherein the output signal of the magnetic field sensor is to be evaluated time-continuously, for example the tooth-flank detection of crankshafts or camshafts in the automobile. With such applications, the output signal of the magnetic field sensor is to be processed with a high time resolution.

It is the task of the invention to offer a magnetic field sensor whose output signal is continuous over time and illustrates the magnetic field apprehended by the Hall-element with great precision.

SUMMARY OF THE INVENTION

The invention uses as a filter circuit a ladder-type filter, where the capacitor contained at each stage is charged in the first timing phase with the difference signal amplified if need be, and in the second timing phase with the inverted difference signal. As a result of the rectangular switchover, the useful signal contained in the difference signal, which corresponds to the magnetic field apprehended, is also mutually inverted in both timing phases. Accordingly, the common mode signals in the difference signal which overlay at each filter stage because of the electronic components, e.g. offset voltages, are equalized in the temporal average. Such common mode signals which occur are thus altogether eliminated, whereas the useful signal delivered by the rectangular change-over switch is, if need be in an amplified form, reproduced with great precision. By means of the ladder-type filter low pass filters of low cut-off frequency can be achieved. Consequently, the signal produced by the magnetic field sensor and full of discontinuities resulting from the chopper operation can be given off continuously over time and be further processed.

An embodiment of the invention uses an active ladder-type filter as a filter circuit. A ladder-type filter of this kind is described for example in IEEE J. Solid-State Circuits, vol. SC-26, no. 12, pp.1988–1997, December 1991. A ladder-type filter of this kind has the advantage that it has exceptional filtering characteristics, and can be produced relatively simply in CMOS technology. As amplifying elements preferably OTA (operational transconductance amplifier) modules can be used, which work in gyrator switching. These OTA modules are also designated as transconductance amplifiers. The gyrator switching makes possible the transformation of an impedance into the dual impedance thereof. By means of the gyrator switching inductive components of a filter with use of capacitors can be achieved. In this way, the ladder-type filter can be made up in small construction size as monolithically integratable circuit, although to a considerable extent it contains inductive aspects, which as a passive LC ladder-type filter would require a considerable construction volume in order to create the desired filtering performance, but could certainly not be represented monolithically.

It is well known that OTA modules have a considerable offset component, whereby the output signal of the active ladder-type filter contains overall a considerable offset voltage. An offset voltage of this kind would destroy again the measurement precision of the apprehension of the magnetic field achievable by the rectangular switchover. According to the invention, OTA modules connected in series in the ladder-type filter are connected through their inlets and outlets in a chopper operation in such a way that the offset voltages occurring, which show themselves as voltages at the capacitors, compensate in successive timing phases. For this, the outlet voltages of the OTA modules are fed to the capacitors alternately, dependent on the timing signal, i.e. in the first timing phase via the inverting outlet to the first capacitor and in a second timing phase via the same inverting outlet to the second capacitor. The non-inverting outlet is connected correspondingly. In this way, a chopper operation is achieved, wherein the offset voltages of the OTA modules are compensated and no longer occur in the output signal of the ladder-type filter. This ladder-type filter creates a time-continuous output signal, the frequency of the timing signal being suppressed by the low pass performance of the ladder-type filter. Accordingly, a voltage exists at the outlet of the ladder-type filter which has no discontinuities even at the points in time of the switchover of the rectangular change-over switch, and can be processed further with high time resolution. The great precision of the illustration of the magnetic field size apprehended by the Hall-element achieved by the rectangular change-over switch is retained.

BRIEF DESCRIPTION OF THE DRAWINGS

An embodiment of the invention is set out in the following by means of the drawing, which shows.

DETAILED DESCRIPTION OF THE PREFERRED EMBODIMENTS

Figure 1:
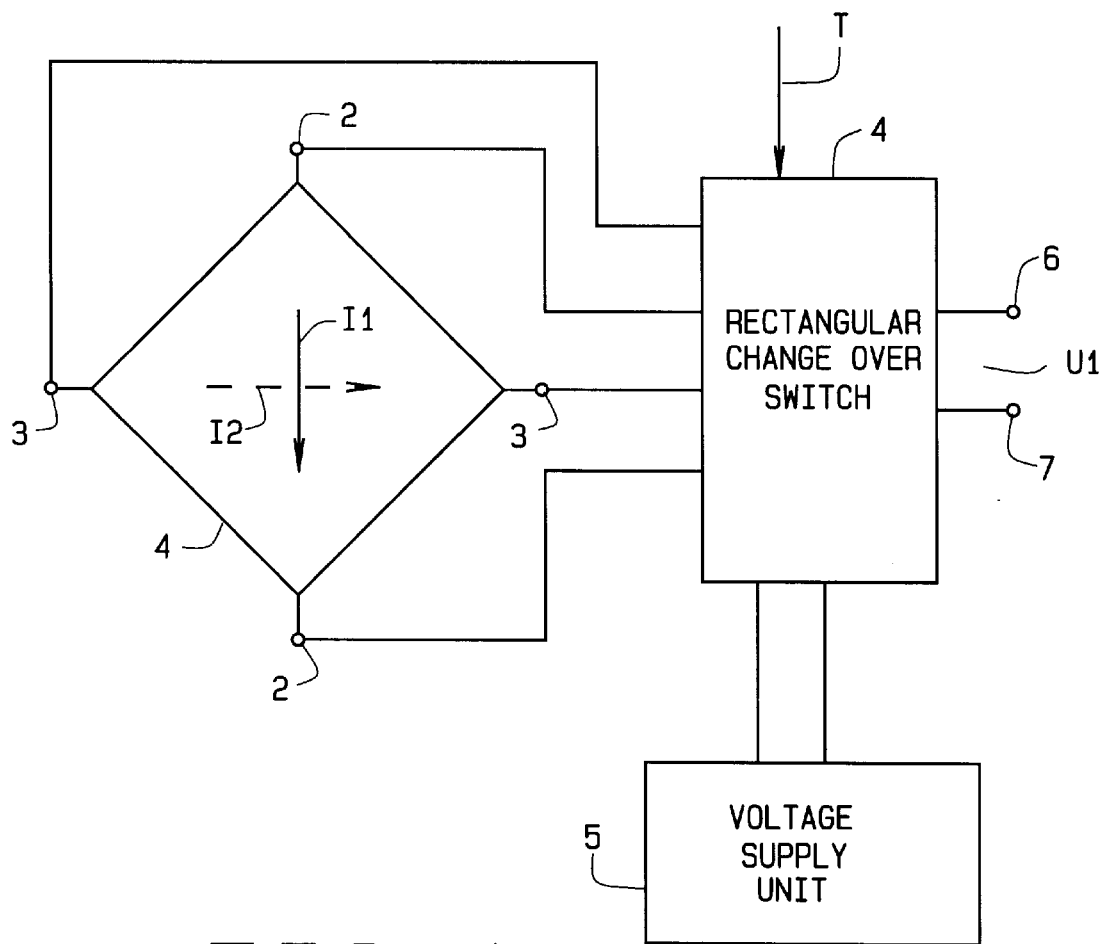
FIG. 1—a switching arrangement for a Hall-element with a rectangular change-over switch, FIG. 2—the arrangement of a ladder-type filter according to a Gm-C filter, FIG. 3—two OTA modules connected in series in the ladder-type filter and their wiring, FIG. 4—an equivalent circuit diagram with R-, L-, C-elements for the ladder-type filter.

In FIG. 1, there is represented a circuit diagram for a magnetic field sensor according to the invention in the form of a block diagram. A Hall-element 1 has a first pair of connection terminals 2, 2 and a second pair of connection terminals 3, 3. The terminals 2, 2 and 3, 3 are linked up to a rectangular change-over switch 4, which is activated by a timing signal T. The rectangular change-over switch 4 is also linked with a voltage supply unit 5, which supplies the control current for Hall-element 1. The voltage U1 is picked off at terminals 6, 7 of the rectangular change-over switch 4. The rectangular change-over switch 4 is programmed in such a way that, dependent on timing signal T in a first timing phase P1 via the connection terminals 2, 2, it sends current 11 from the voltage supply unit 5 to the Hall-element 1. Hall-voltage U1 can be picked off at terminals 3, 3 in this phase P1.

In the second timing phase P2 of timing signal T the quantitatively same control current 12 is sent to terminals 3, 3; the Hall-voltage is then picked off at terminals 2, 2 i.e. the voltage U1 corresponds to the voltage at terminals 2, 2. In voltage U1 there is contained, along with a useful signal component which is proportional to the magnetic field to which Hall-element 1 is exposed, also the offset voltage of Hall-element 1, which arises because of a not ideal geometry of the Hall-element and as a result of piezo resistive effects on compressing the Hall-element in the plastic housing. The useful signal components both remain similarly directed in both timing phases P1 and P2; in contrast, the offset signal components in voltage U1 in successive phases P1, P2 are cancelled out and can thereby be eliminated. A more precise description of this effect is described in DE-A-44 31 703 of the same applicant. This document is hereby incorporated by reference into the disclosure of the present application.

Figure 2:
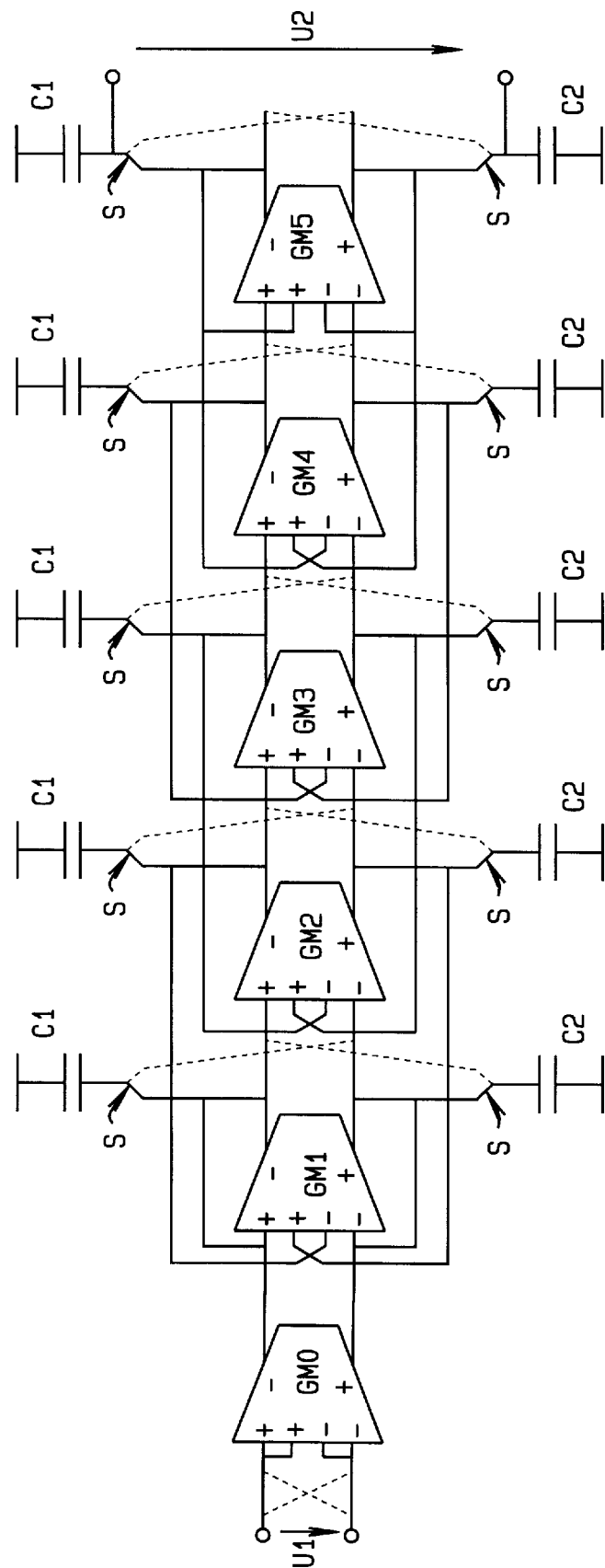

FIG. 2 shows diagrammatically as an embodiment a switching arrangement for an active ladder-type filter that is achieved with CMOS technology. The ladder-type filter is of a type of Gm-C-filter, which is frequently also designated as a transconductance-capacitor-continuous-time-filter in accordance with the Anglo-Saxon designation. The design of a filter of this kind and the performance of the filter is described in more detail in IEEE J. Solid-State Circuits, vol. SC-26, no.12, pp. 1988–1997, December 1991. The ladder-type filter according to the invention contains six OTA modules gm0, gm1, gm2, gm3, gm4, gm 5. The OTA modules work in gyrator switching, i.e. they produce an inductive performance with the use of capacitors. In this way a low pass filter with low cut-off frequency and high quality can be achieved without real inductivities being needed. Other active ladder-type filters, which for example correspond to a RC ladder-type filter or contain operation amplifiers instead of transconductance amplifiers, are also usable with suitable dimensioning.

Figure 3:
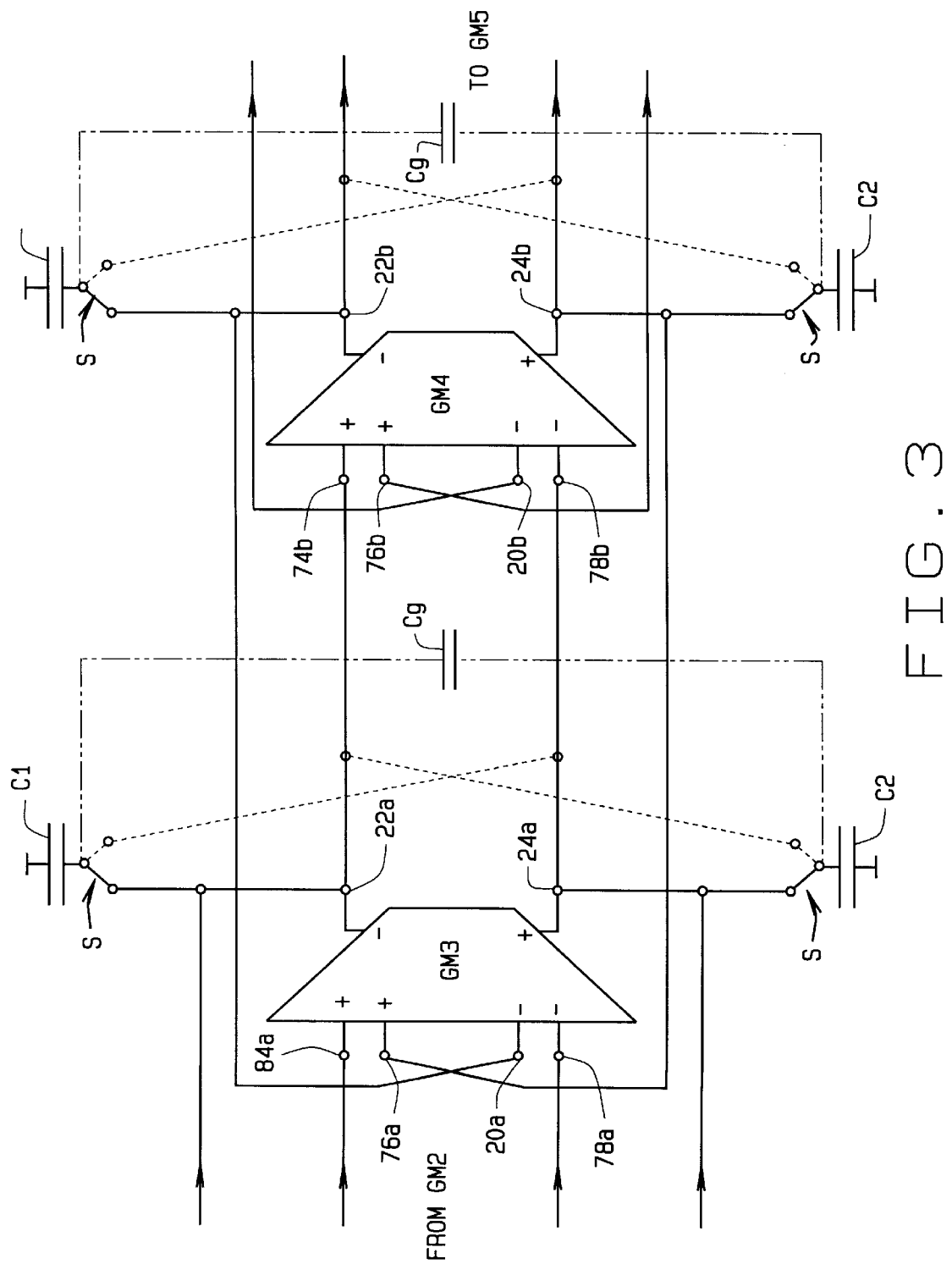

Every OTA module gm0 to gm5 has two inverting inlets that are designated with a minus sign. Furthermore, every OTA module has two non-inverting inlets that are designated with a plus sign. The inverting outlets of the OTA modules are designated with a minus sign and the non-inverting outlets with a plus sign. The OTA module gm0 is designed as an inlet amplifier; the further OTA modules gm1 to gm5 are connected with their outlets to capacitors C1, C2 via switches S. In the embodiment of FIG. 2 and FIG. 3 all capacitors C1, C2 are selected at the same size on account of simpler description and representation. The switches S are turned in their switch positions dependent on timing signal T. In the first timing phase P1 the switches S have the positions shown in FIG. 2. In the second timing phase P2 the switches S change over so that the other outlets with reversed polarity of the relevant OTA module are connected to the capacitors Cl, C2 respectively. The outlet voltage U2 of the ladder-type filter is picked off as difference voltage from the capacitors C1, C2 found on the right in FIG. 2. Contrary to the embodiment of FIG. 2 and FIG. 3 with two capacitors C1, C2 at every OTA module, it is also possible to use just a single capacitor Cg per OTA module, which then is connected floatingly between the inverting and non-inverting outlet.

FIG. 3 shows by way of example in a detailed representation the wiring for the OTA modules gm3 and gm4. For the other OTA modules gm1, gm2 and gm5 the wiring is arranged correspondingly. The OTA modules gm3 and gm4 have a first non-inverting inlet 14a, 14b and a second non-inverting inlet 16a, 16b, a first inverting inlet 18a, 18b and a second inverting inlet 20a, 20b. Furthermore, the OTA modules gm3 and gm4 have an inverting outlet 22a, 22b and a non-inverting outlet 24a, 24b. The inverting outlets 22a, 22b are linked up to a capacitor C1 via switches S; in the same way the non-inverting outlets 24a and 24b are linked up to capacitor C2 via switches S.

The difference voltage signal of the previous OTA module gm2 is fed to OTA module gm3 at its first non-inverting inlet 14a and to its first inverting inlet 18a. The inverting outlet 22b of the OTA module gm4 connected in series is linked up to the second inverting inlet 20a of OTA module gm3. The non-inverting outlet 24b of OTA module gm4 is linked up to the second non-inverting inlet 16a of OTA module gm3.

As mentioned, the switch position of switches S is set so as to be dependent on the timing signal T. The position shown in FIG. 3 holds good for the first timing phase P1. In this first timing phase P1 the inverting outlets 22a, 22b of the first OTA module gm3 and of the second OTA module gm4 are linked up to the first capacitor C1 respectively. The non-inverting outlets 24a, 24b of the first OTA module gm3 and of the second OTA module gm4 are respectively linked up to the second capacitor C2. In this timing phase P1 the capacitors C1, C2 are charged up according to the wiring described. In the second timing phase P2 the switches S are switched to their other position, which is represented in FIG. 3 in broken lines. Accordingly, the inverting outlets 22a, 22b of the first module gm3 and of the second OTA module gm4 are linked up respectively to capacitor C2 and the non-inverting outlets 24a, 24b of the first OTA module gm3 and of the second OTA module gm4 with the first capacitor C1. The capacitors C1, C2 are then charged corresponding to this positioning of the switching of switches S. A chopper operation is achieved by the switching between switches S depending on the timing signal. During this chopper operation signal outlets are constantly exchanged for charging capacitors C1, C2. In this way, the offset signals occurring at the OTA modules are suppressed by an averaging in time. As the timing signal T controls simultaneously switches S and rectangular change-over switch 4, the offset voltage suppression is retained as a result of the rectangular change-over switching also in the case of the ladder-type filter connected in series.

The dimensioning of the transconductances gm of the individual OTA modules gm0 to gm5 and the size of the integrated capacitors C1, C2, Cg determine the frequency response of the ladder-type filter. The dimensioning of the elements of the ladder-type filter is preferably done in such a way that all capacities are selected as different multiples of a basic capacity C0 and all transconductances as different multiples of a basic transconductance gm0. The quotient gm0/C0 determines the cut-off frequency of the filter, whereas the amplification is determined by the ratios of the transcoductances to each other. With the feedback OTA modules gm1 to gm5 in the embodiment of FIG. 2 and 3, the amplification of the respective transconductance stage is brought about by the fact that with the respective OTA module gm1 to gm5 the transconductance set for the signal main flow direction (corresponding to outlets 14a, 14b, or 18a, 18b in FIG. 3) is greater than the transconductance set for the signal feedback direction (corresponding to inlets 16a, 20a or 16b, 20b in FIG. 3). Should the ratio of these transconductances gm be for example 3:1, then the associated OTA module has the amplification factor 3. Should both transconductances gm be the same, then the signal amplification factor is 1 and the signal is not altered in size.

The ladder-type filter has a low pass function. The filter frequency of this low pass is at least smaller by a factor of 2 than the frequency of timing signal T, which corresponds to the chopper frequency, e.g. corresponding to 300 kHz. This filter frequency in the embodiment is smaller by a factor of 5 than the frequency of timing signal T. Typically, the cut-off frequency of the ladder-type filter here is in the range of 30 kHz to 100 kHz, preferably in the range of 60 kHz. With such dimensioning there is produced for a Hall signal, whose useful signal frequency range reaches from 0 Hz to approx. 10 kHz, a continuous output signal with a high time resolution, without the occurrence of discontinuities.

In the case of the voltage U1 applied at the inlet of the ladder-type filter there occurs alternately the sum of and difference between the offset voltage of Hall element 1 and Hall voltage. At the outlet of the ladder-type filter and in the intermediate signals of the filter the Hall voltage is formed constantly in due phase, i.e. the voltages at the capacitors C1, C2 correspond to the respective Hall voltage, which is a low frequency continuous signal or even a DC signal. The offset voltages appear at the capacitors C1, C2 in due phase as AC signals and are filtered away as a result of the low pass filter character of the ladder-type filter. At the outlet of the ladder-type filter there is created accordingly the offset-free, low pass filtered voltage U2, which corresponds to the Hall voltage given off from Hall element 1 in accordance with the size of the magnetic field. According to the invention, the Hall voltage can thus pass through the ladder-type filter in the useful signal frequency range, for example in the range from 0 Hz to 10 kHz, without attenuation, while the offset voltage of Hall element 1 and the offset voltages of the OTA modules gm0 to gm5 are modulated as alternating signals on the chopper-frequency, for example 300 kHz. Due to the low pass nature of the ladder-type filter, for example, with a low pass filter frequency of 60 kHz, this alternating signal is filtered away. There then forms a voltage U2 in the temporal average at the outlet of the ladder-type filter, in which voltage U2 the offset voltages which occur are suppressed. The filter can be implemented affordably with CMOS technology as a transconductance C filter, i.e. as a Gm-C-filter. The entire magnetic field sensor can thus be achieved with a small construction size as a component together with the ladder-type filter as a monolithically integratable circuit.

Figure 4:
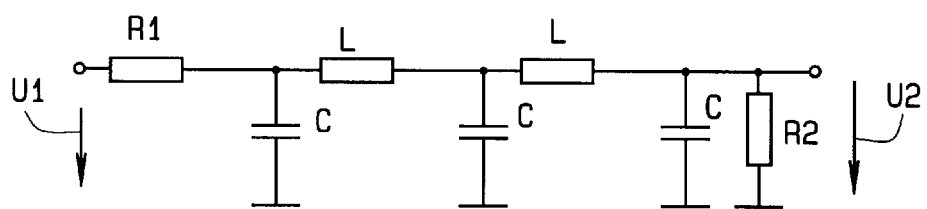

FIG. 4 shows a LCR equivalent circuit diagram of the ladder-type filter shown in FIG. 2. The inductivities L are achieved by the gyrator switching of the OTA modules. The resistors R1 and R2 are defined by parameter settings of the OTA modules gm0 to gm5. As can be seen, the equivalence circuit diagram defines a multi-stage low pass filter.

What is claimed is:

1. A magnetic field sensor with a Hall element and with a rectangular change-over switch, which switches between connections for a power supply to the Hall element and connections for a Hall voltage dependent on a timing signal, and with a filter circuit which filters a signal delivered by the rectangular change-over switch, characterized in that there is provided a multi-stage ladder-type filter as the filter circuit, to which the signal is fed as a differential signal, and that every stage contains at least one capacitor which is charged dependent on the timing signal in a first timing phase with the differential signal selectively amplified and in a second timing phase with an inverted differential signal.

2. The magnetic field sensor according to claim 1, characterized in that the ladder-type filter is designed as an active ladder-type filter.

3. The magnetic field sensor according to claim 2, characterized in that the active ladder-type filter contains at least two OTA modules connected in series, which work in gyrator switching, that each OTA module has a first non-inverting inlet and a second non-inverting inlet, a first inverting inlet and a second inverting inlet, as well as an inverting outlet and a non-inverting outlet, that the signal selectively amplified is fed to the first OTA module at the first non-inverting inlet and at the first inverting inlet, that to the at least two OTA module respectively there is set a first capacitor and a second capacitor or a common capacitor, that the inverting outlet of the second OTA module connected in series to the first OTA module is linked up to the second inverting inlet of the first OTA module, that the non-inverting outlet of the second OTA module is linked up to the second non-inverting inlet of the first OTA module, that, dependent upon the timing signal in the first timing phase the inverting outlets of the first OTA module and of the second module are linked up respectively to the first capacitor or to a first connection of the common capacitor, and the non-inverting outlets of the first OTA module and of the second OTA module are linked up respectively to the second capacitor or with a second connection of the common capacitor, and that in the second timing phase of the timing signal the inverting outlets of the first OTA module and of the second OTA module are linked up respectively with the second capacitor or with the second connection of the common capacitor and the non-inverting outlets of the first OTA module and of the second OTA module are linked up together with the first capacitor or with the first connection of the common capacitor for achievement of a chopper operation.

4. The magnetic field sensor according to claim 3, characterized by further OTA modules having a wiring according to the first and second OTA modules for construction of a multi-stage ladder-type filter.

5. The magnetic field sensor according to claim 1, characterized in that the ladder-type filter is switched as a low pass filter with a filter frequency at least smaller by a factor of 2 than a frequency of the timing signal.

6. The magnetic field sensor according to claim 5, characterized in that a cut-off frequency of the ladder-type filter lies in a range of 30 kHz to 100 kHz.

7. The magnetic field sensor according to claim 1, characterized in that the ladder-type filter in CMOS technology is achieved as a transconductance-C-filter.

8. The magnetic field sensor according to claim 3, characterized in that, in order to achieve a chopper operation, the capacitors are linked by means of CMOS switches with the outlets of the OTA modules.

9. The magnetic field sensor according to claim 3, characterized in that at least with one OTA module, the transconductance set to a signal main flow direction is greater than the transconductance set to a signal feedback direction.

* * * * *

UNITED STATES PATENT AND TRADEMARK OFFICE
CERTIFICATE OF CORRECTION

PATENT NO.   : 6,433,544 B1
DATED        : August 13, 2002
INVENTOR(S)  : Mario Motz It is certified that error appears in the above-identified patent and that said Letters Patent is hereby corrected as shown below:

Column 2,
Line 44, "drawing, which shows" should be -- drawings, which show --.

Column 3,
Line 2, "11" should be -- I 1 --.
Line 6, "12" should be -- I 2 --.
Line 39, "gmO" should be -- gm0 -- (a zero, not an "O")

Column 4,
Line 51, "transcoductances" should be -- transcondunctances --.
Line 52, "FIG." should be -- FIGS. --.

Signed and Sealed this

Eleventh Day of February, 2003

JAMES E. ROGAN
*Director of the United States Patent and Trademark Office*